United States Patent [19]

Jaffe

[11] 3,760,237

[45] Sept. 18, 1973

[54] SOLID STATE LAMP ASSEMBLY HAVING CONICAL LIGHT DIRECTOR

[75] Inventor: Mary S. Jaffe, Cleveland Heights, Ohio

[73] Assignee: General Electric Company, Schenectady, N.Y.

[22] Filed: June 21, 1972

[21] Appl. No.: 264,861

[52] U.S. Cl. ..... 317/234 R, 317/234 G, 317/234 E, 317/235 N, 313/108 D

[51] Int. Cl. ..... H01l 3/00, H01l 5/00

[58] Field of Search ..... 317/234, 3, 3.1, 317/4, 27; 29/588; 313/108 D

[56] References Cited

UNITED STATES PATENTS

| | | | |
|---|---|---|---|
| 2,711,464 | 6/1955 | Anderson et al. | 317/235 N |
| 2,809,332 | 10/1957 | Sherwood | 317/234 D |
| 3,281,606 | 10/1966 | Lueck | 317/235 N |
| 3,501,676 | 3/1970 | Adler et al. | 317/235 N |
| 3,512,027 | 5/1970 | Kudsky | 317/235 N |
| 3,639,770 | 2/1972 | Zizelmann | 317/235 N |

OTHER PUBLICATIONS

IBM Technical Disclosure Bulletin; by Stuby, Vol. 10, No. 8, January 1968, page 1120.

*Primary Examiner*—John W. Huckert
*Assistant Examiner*—Andrew J. James
*Attorney*—Norman C. Fulmer et al.

[57] ABSTRACT

A lens cap is positioned over a light-emitting diode, and a somewhat conical-shaped plastic light director extends between and in intimate contact with the lens cap and the diode, the smaller end of the conical light director being at the diode. A method of manufacture is disclosed in which a viscous plastic monomer is placed in the lens cap and/or on the diode and allowed to deform by gravity to form the conical light director.

9 Claims, 7 Drawing Figures

SOLID STATE LAMP ASSEMBLY HAVING CONICAL LIGHT DIRECTOR

BACKGROUND OF THE INVENTION

The invention is in the field of solid state lamp construction utilizing light-emitting diodes.

Solid state lamps create light at a p-n junction which may be formed in various semiconducting materials such as gallium arsenide, gallium phosphide, other III–V compounds and alloys, and silicon carbide. Such lamps have advantages of durability, long life, and low power consumption. However, such lamps are generally inefficient because much of the light generated at the p-n junction is absorbed by the diode material, and also much of the light is internally reflected within the diode, due to the high refractive index of all the parent compounds, and does not exit as useful light output. Several ways have been devised for increasing the useful light output of a solid state lamp. U.S. Pat. No. 3,458,779 to Blank and Potter describes a lens cap arrangement for directing the light in a desired pattern. U.S. Pat. Nos. 3,443,140 to Ing and Jensen and 3,353,051 to Barrett and Jensen describe p-n junction diodes in which the semiconductor material above the p-n junction is shaped somewhat conically, with increasing cross-sectional area in a direction away from the p-n junction, to function as a light reflector for increasing the useful light output. U.S. Pat. No. 3,510,732 to Amans describes a plastic lens formed over and around a p-n junction light-emitting diode to increase the "critical angle" over which light is able to emerge from the surface of the diode without being internally reflected at the surface.

SUMMARY OF THE INVENTION

Objects of the invention are to provide an improved solid state lamp construction and method of manufacture thereof, and to provide such a construction and method that is low in cost and which increases the useful light output from a light-emitting diode.

The solid state lamp construction of the invention comprises, briefly and in a preferred embodiment, a light-emitting diode, a lens cap positioned over said diode, and an approximately conical shaped plastic light director extending between and in intimate molded optical contact with the closed end region of the lens cap and the diode, the smaller end of the conical light director being at the diode, whereby the conical light director functions to reflect and direct light from the diode to the closed end region of the lens cap. The end region of the lens cap may, but need not necessarily, be shaped to provide a focusing effect on the light.

In one embodiment of the method of assembly, a viscous plastic monomer is placed in the lens cap and allowed to deform by gravity and come into contact with the diode to form the conical light director. In a modification of the method, the viscous plastic monomer is placed on the diode which is held upside down while the monomer deforms by gravity against the lens cap. In a further modification, viscous plastic monomer is placed both in the lens cap and on the diode, and the two are brought together by gravity so that the plastic monomers merge. The diode may be mounted on a pedestal to facilitate the formation of the conical light director, and the inner end region of the lens cap may be convex in shape to facilitate the formation of the conical light director.

DESCRIPTION OF THE PREFERRED EMBODIMENTS

Figure 1:
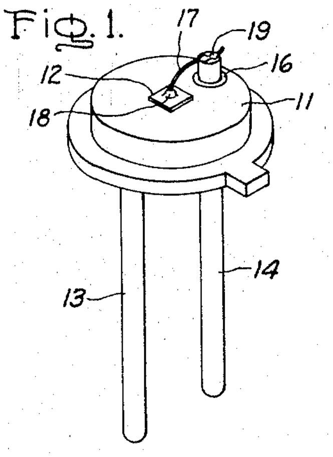
FIG. 1 is a perspective view of a light-emitting diode mounted on a support member which is a so-called "transistor header"

The light-emitting diode and header support means shown in FIG. 1 is essentially the same as that described in detail in the above-referenced Blank and Potter U.S. Pat. No. 3,458,779, and comprises a circular metal support header 11 having a light-emitting diode 12 attached to the top surface thereof. A first connector wire or post 13 extends downwardly from the header 11, and a second connector wire or post 14 extends through an opening in the header 11 and is attached thereto by insulator means 16. An end of a small, fine connector wire 17 is bonded to a small contact region 18 on the diode 12, the other end thereof being welded or otherwise attached to the upper end 19 of the second connector post 14. The light-emitting diode 12, made from any suitable material, is provided with a p-n junction therein, substantially parallel to the top surface of the header 11, which emits light when suitable current is passed therethrough by applying suitable electrical energy across the connector posts 13 and 14.

Figure 2:
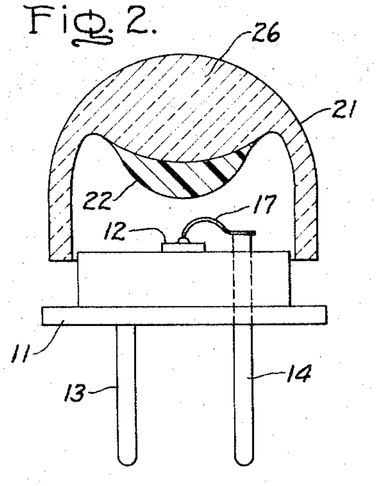
FIGS. 2 and 3 show one form of the invention, in partly sectional side views, FIG. 2 showing a lens cap positioned over the diode and header of FIG. 1 and with a drop of viscous plastic monomer carried inside the closed end region of the lens cap, and FIG. 3 showing the lens cap in final cemented position on the header, the plastic monomer having deformed by gravity and surface tension to form a somewhat conical light director between the diode and lens cap.
Figure 3:
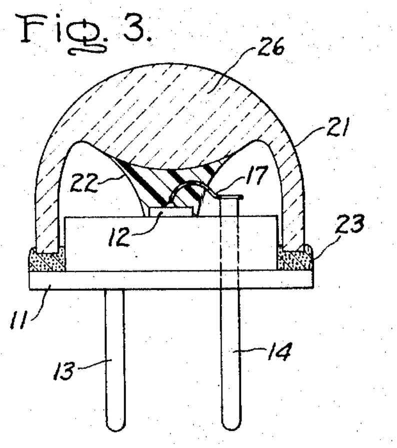

In the embodiment of FIGS. 2 and 3, a lens cap 21, preferably made of glass or transparent plastic, is placed in an inverted position over the diode 12 and header 11 and is provided with a certain amount of viscous material 22 which is deformable by gravity and subsequently cures with time and/or heating. The material 22 should be transmissive for the light (visible or infrared) emitted by the diode 12. A suitable viscous material 22 is a viscous plastic monomer which subsequently cures by polymerizing and thus becomes a solid, such as RTV silicone rubber. A specific suitable material is General Electric Company RTV silicone rubber No. 615, which comes with a catalyst to be mixed therewith. The mixture should be outgassed before use. The lens cap 21 and header 11 in FIG. 2 are held in position by means of suitable jigs or fixtures, while the viscous material 22 deforms downwardly due to gravity and comes into intimate molded contact with the top of the diode 12, as shown in FIG. 3. During the downward deformation of the viscous material 22, the lens cap 21 may be adjusted upwardly or downwardly with respect to the header 11, and heating or cooling may be applied, as required, to cause the viscous material 22 to form an inverted conical cross-sectional shape as shown in FIG. 3, with the smaller end of the cone over the top of the diode 12, and optionally also over a portion of the top surface of the header 11 surrounding the diode 12. At about this time in the manufacturing process, the viscous material 22 begins to cure to a permanent resilient shape, and will retain its approximately conical cross-sectional shape, and the lens cap 22 is cemented around the open inner-end rim thereof to the header 11 by means of cement 23. If necessary, at this stage, the assembly shown in FIG. 3 may be turned and oriented in various different directions to maintain the material 22, while curing, in the substantially conical shape as shown. Being resilient after fully cured, the plastic monomer 22 retains its conical shape and also "gives" with any jarring or slight relative movement between the diode 12 and lens cap 21, so as to remain in intimate molded contact with the diode 12 and lens cap 21 and maintain effective light coupling therebetween.

The closed outer end region of the lens cap 21 may be shaped to provide a light-focusing biconvex lens 26, if desired, or may be any other suitable shape. The member 21 is referred to as a lens cap herein, for convenience and clarity, even though it need not necessarily be provided with an actual light-focusing lens 26 as shown. However, a convex inner curvature of the lens cap, as shown, aids in maintaining the relatively larger area of the upper end of the viscous material 22, thus facilitating the aforesaid conical shaping of the light director. In operation, the conical walls of the conical light director 22, shown in FIG. 3, reflect and direct light emitted upwardly from the diode 12, to and through the upper part of the lens cap 21, thereby increasing the useful light output of the structure, in similar manner as achieved by the cone-shaped semiconductor diode bodies described in the above-referenced U.S. Pat. Nos. 3,443,140 and 3,353,051. The above-described conical shape of the deforming material 22 is caused partly by its surface tension, along with the gravity effect. The exact amount of material 22 to be used depends on the sizes, and spacing between, the lens cap 21 and the diode 12. If the optical index of refraction of the material from which the cone 22 is made, is less than that of the material of which the diode 12 is made, but greater than that of air, it will cause an increase in the critical angle at which light generated within the diode 12 will be able to escape from the upper surface of the diode, thereby increasing the amount of light output from the diode 12, in well known manner. The conical light director 22 also has an effect of magnifying the light diode 12, when the structure is viewed through the top of the lens cap 21, by a factor of two in some examples that were made; this magnification of the light source size is associated with the phenomenon of increased light output obtained by the use of the inverted cone section light coupler.

Figure 4:
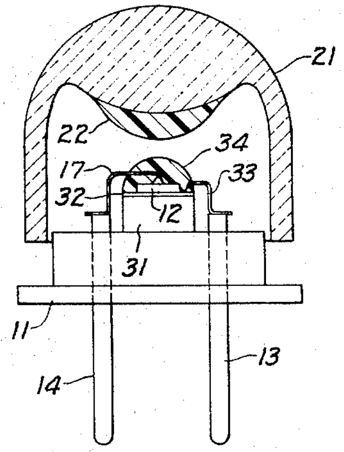
FIGS. 4 and 5 show in partly sectional side views a modified form of the invention, FIG. 4 showing the lens cap positioned over the diode and header, the diode being carried on a pedestal attached to the header, and plastic monomer placed both within the lens cap and over the diode, and FIG. 5 showing the final arrangement, with the lens cap cemented to the header, and in which the plastic monomer has deformed by gravity and surface tension to form a conical light director.
Figure 5:
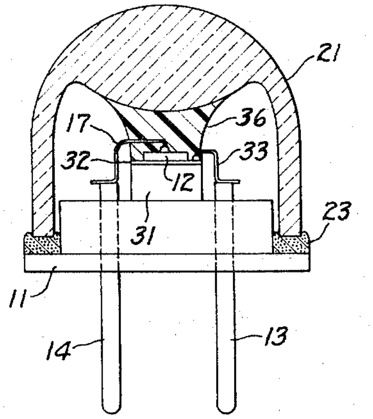

The modified construction shown in FIGS. 4 and 5 differs from that of FIGS. 2 and 3, in that the light-emitting diode 12 is mounted on the top of a pedestal 31 which may be made of thermally insulating material such as alumina, if desired, preferably having a square cross-sectional shape slightly larger than the square cross-sectional shape of the diode 12 and being, for example, 3/32 of an inch on each side. The pedestal 31 is attached to the upper surface of the header 11 by suitable means such as cement, and the insulated connecting post 14 is connected at the top thereof to a small area contact at the top of the diode 12 by means of a fine wire 17, the other connector post 13 also extending through the header 11 and being insulated therefrom. The top of the platform 31 is covered with plated metal or a conductive cement 32, to the top of which the diode 12 is connected electrically and mechanically, and a second fine connector wire 33 interconnects the electrical coating 32 and the top of the connector post 13. In this modification, an additional amount of viscous material 34 is positioned over the top of the diode 12 and platform 31, in addition to the viscous material 22 carried at the underside of the closed end of the lens cap 21, as shown in FIG. 4. The size of the pedestal 31 maintains the viscous material 34 in place over the top of the diode and pedestal. With the elements positioned as shown in FIG. 4, the viscous material 22 deforms downwardly due to gravity, and comes into contact and merges with the viscous material 34 covering the diode, and the lens cap 21 is raised or lowered, and heated or cooled, as required, to cause the merged viscous materials to form a substantially conical light director 36 as shown in FIG. 5, whereupon the lens cap 21 is cemented to the rim of the header 11 by means of suitable cement 23. As described above, the assembled unit of FIG. 5 may be turned, rotated, and oriented as may be required to insure the continuing conical shape of the light director 36 until the viscous material thereof becomes cured and hardened into its final permanent state.

Figure 6:
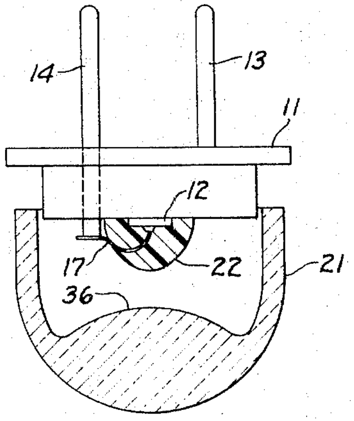
FIGS. 6 and 7 are partly sectional side views of another modified form of the invention in which the diode and header are positioned upside down, the lens cap being positioned under the diode and header, with a plastic monomer positioned at the diode, FIG. 7 showing the completed construction with the lens cap cemented to the header, and in which the plastic monomer has deformed to come into contact with the closed end region of the lens cap, thereby forming a somewhat conical light director.
Figure 7:
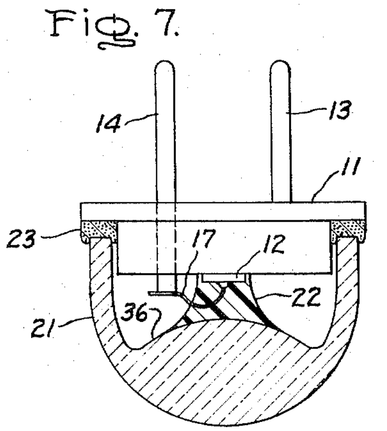

The modification of FIGS. 6 and 7 is generally similar to that of FIGS. 2 and 3, except that the conical light director is formed in an inverted position of the parts of the lamp. More specifically, the viscous material 22 is positioned over the diode 12 and a portion of the header 11 immediately surrounding the diode 12, whereupon the header 11 and diode 12 are held in inverted position, the lens cap 21 being held in an inverted position under the diode 12, while the viscous material 22 deforms downwardly by gravity and comes into contact with the inner surface of the closed end of the lens cap 21 and forms the conical shape as shown in FIG. 7. As described above, the lens cap 21 is moved up and down with respect to the header 11, and heating or cooling may be applied, to obtain the desired conical shape of the light director as shown in FIG. 7, whereupon the lens cap is cemented to the header 11 by means of cement 23. As described above, the assembled unit may be moved around in different directions, as may be required, to maintain the conical shape of the light director 22 shown in FIG. 7, until the material 22 cures and hardens. In the embodiment of FIGS. 6 and 7, the desired conical shape of the light director 22 is aided by shaping the closed end region of the lens cap 21 in the form of a light-directing lens having an inner convex curvature 36, which facilitates the spreading out of the material 22 when it comes into contact with the convex surface 36.

The terminology "conical" as applied to the shape of the light director, is to be understood as meaning substantially or approximately a cone shape. The actual conical shape of the light director, in samples that have been made, has a cross-sectional dimension increasing approximately exponentially in area in a direction axially away from the diode, as shown in FIGS. 3, 5, and 7 of the drawing.

While preferred embodiments and modifications of the invention have been shown and described, various other embodiments and modifications will become apparent to persons skilled in the art, and will fall within the scope of invention as defined in the following claims.

What I claim as new and desire to secure by Letters Patent of the United States is:

1. A solid state lamp construction comprising a light-emitting diode, mounting means for holding said diode, and a lens positioned over said diode and its mounting means with a surface of the lens spaced from and facing a surface of the diode, wherein the improvement comprises a conical shaped light director extending between and in intimate molded contact with said surface of the diode and said surface of the lens, the smaller end of said conical light director being at said diode.

2. A lamp construction as claimed in claim 1, in which said surface of the lens is shaped to have a convex curvature facing toward said diode.

3. A lamp construction as claimed in claim 2, in which said lens is shaped to provide a biconvex lens.

4. A lamp construction as claimed in claim 2, including a lens cap having a symmetrically circular cross-sectional shape, said lens being at an end of said lens cap, said lamp construction including a circular header, means for mounting said diode on said circular header, said lens cap being positioned with the open inner rim end thereof surrounding at least a portion of said circular header, and means for attaching said lens cap and header together at said open inner rim end of the lens cap.

5. A lamp construction as claimed in claim 4, in which said means mounting the diode on the header comprises a pedestal member attached at the bottom thereof to said header, said diode being attached to the top surface of said pedestal member, said top surface of the pedestal member being larger than the diode, the diode being positioned within the confines of said top surface of the pedestal member, and said smaller end of the conical light director being in intimate molded contact with said surface of the diode and also with the portion of said top surface of the pedestal member around said diode.

6. A lamp construction as claimed in claim 1, in which said conical shaped light director is of a material which is permanently resilient.

7. A lamp construction as claimed in claim 6, in which said material of the light director is a cured viscous plastic monomer.

8. A lamp construction as claimed in claim 7, in which said viscous plastic monomer is silicone rubber.

9. A lamp construction as claimed in claim 1, in which the cross-sectional area of said conical shaped light director increases approximately exponentially in the direction away from said diode.

* * * * *